United States Patent

Feldmann

(10) Patent No.: US 9,158,205 B2
(45) Date of Patent: Oct. 13, 2015

(54) OPTICAL ARRANGEMENT FOR THREE-DIMENSIONALLY PATTERNING A MATERIAL LAYER

(71) Applicant: Carl Zeiss SMT GmbH, Oberkochen (DE)

(72) Inventor: Heiko Feldmann, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 14/526,839

(22) Filed: Oct. 29, 2014

(65) Prior Publication Data

US 2015/0098071 A1    Apr. 9, 2015

Related U.S. Application Data

(63) Continuation of application No. 12/607,612, filed on Oct. 28, 2009, now abandoned.

(30) Foreign Application Priority Data

Oct. 30, 2008 (DE) .......... 10 2008 043 324

(51) Int. Cl.
*G03F 7/20* (2006.01)
*G03F 7/00* (2006.01)
(Continued)

(52) U.S. Cl.
CPC .......... *G03F 7/70258* (2013.01); *G03F 7/0037* (2013.01); *G03F 7/201* (2013.01); *G03F 7/70341* (2013.01); *G03F 7/70416* (2013.01); G02B 5/0236 (2013.01); G02B 5/0284 (2013.01); G02B 5/32 (2013.01)

(58) Field of Classification Search
None
See application file for complete search history.

(56) References Cited

U.S. PATENT DOCUMENTS

| 3,526,505 A | 9/1970 | Kroemer |
| 3,582,176 A | 6/1971 | Mathisen |
| 3,677,634 A | 7/1972 | Mathisen |

(Continued)

FOREIGN PATENT DOCUMENTS

| EP | 1 519 227 | 3/2005 |
| EP | 1 785 771 | 5/2007 |

(Continued)

OTHER PUBLICATIONS

Johnson, "Those Clever Experimentalists Fabrication of Three-Dimensional Crystals", Photonic Crystals: Periodic Surprises in Electromagnetism, Massachusetts Institute of Technology 2007, 73 pages. http://ab-initio.mit.edu/photons/tutorial/spie-course-new.pdf.

(Continued)

*Primary Examiner* — Martin Angebranndt
(74) *Attorney, Agent, or Firm* — Fish & Richardson P.C.

(57) ABSTRACT

The disclosure relates to an optical arrangement for three-dimensionally patterning a radiation-sensitive material layer, such as a projection exposure apparatus for microlithography. The optical arrangement includes a mask for forming a three-dimensional radiation pattern, a substrate with the radiation-sensitive material layer, and a projection optical unit for imaging the three-dimensional radiation pattern from the mask into the radiation-sensitive material layer. The optical arrangement is designed to compensate for spherical aberrations along the thickness direction of the radiation-sensitive material layer in order to generate a stigmatic image of the three-dimensional radiation pattern.

20 Claims, 3 Drawing Sheets

(51) Int. Cl.
  *G02B 5/02* (2006.01)
  *G02B 5/32* (2006.01)

(56) References Cited

U.S. PATENT DOCUMENTS

| | | | |
|---|---|---|---|
| 4,379,831 A * | 4/1983 | Lobach | 430/311 |
| 4,402,571 A | 9/1983 | Cowan et al. | |
| 5,311,362 A * | 5/1994 | Matsumoto et al. | 359/738 |
| 5,455,130 A * | 10/1995 | Kamon | 430/5 |
| 5,497,254 A | 3/1996 | Amako et al. | |
| 5,592,259 A * | 1/1997 | Anzai et al. | 355/53 |
| 5,822,042 A | 10/1998 | Goodman | |
| 5,831,715 A * | 11/1998 | Takahashi | 355/53 |
| 5,935,738 A | 8/1999 | Yasuzato et al. | |
| 6,156,463 A | 12/2000 | Saka | |
| 6,391,245 B1 | 5/2002 | Smith | |
| 6,501,571 B1 | 12/2002 | Wang et al. | |
| 7,092,134 B1 * | 8/2006 | Han et al. | 359/35 |
| 7,568,445 B2 | 8/2009 | Rosenberger et al. | |
| 2001/0048184 A1 | 12/2001 | Ueno | |
| 2002/0030680 A1 | 3/2002 | Knebel | |
| 2002/0075458 A1 | 6/2002 | Matsuura et al. | |
| 2002/0093632 A1 | 7/2002 | Teich | |
| 2003/0039896 A1 | 2/2003 | Iriguchi | |
| 2004/0116548 A1 | 6/2004 | Willson et al. | |
| 2004/0145808 A1 | 7/2004 | Cathey et al. | |
| 2005/0019675 A1 | 1/2005 | Hendriks et al. | |
| 2005/0026340 A1 | 2/2005 | Iriguchi | |
| 2005/0147895 A1 | 7/2005 | Chang | |
| 2005/0259785 A1 | 11/2005 | Zhang | |
| 2006/0268253 A1 | 11/2006 | Dodoc | |
| 2006/0275704 A1 * | 12/2006 | Hinsberg, III | 430/273.1 |
| 2006/0291024 A1 | 12/2006 | Parker et al. | |
| 2007/0002312 A1 | 1/2007 | Baluswamy | |
| 2008/0094674 A1 | 4/2008 | Purvis et al. | |
| 2008/0113279 A1 | 5/2008 | Chang | |
| 2009/0191490 A1 | 7/2009 | Feldmann | |
| 2010/0079739 A1 | 4/2010 | Goehnermeier et al. | |
| 2010/0112465 A1 | 5/2010 | Feldmann | |

FOREIGN PATENT DOCUMENTS

| | | | |
|---|---|---|---|
| JP | 03-203737 | * | 9/1991 |
| JP | 2005-300715 | | 10/2005 |
| WO | WO 2006/021818 | | 3/2006 |
| WO | WO 2009/018846 | | 2/2009 |

OTHER PUBLICATIONS

Haske et al., "65 nm Feature Sizes Using Visible Wavelength 3-D Multiphoton Lithography", Optics Express, 2007, vol. 15, No. 6, pp. 3426-3436.

Koreshev et al., "Focused image holograms in high resolution holographic projection photolithography" Opt. Spectrosc. vol. 101 (6) pp. 976-979 (2006).

* cited by examiner

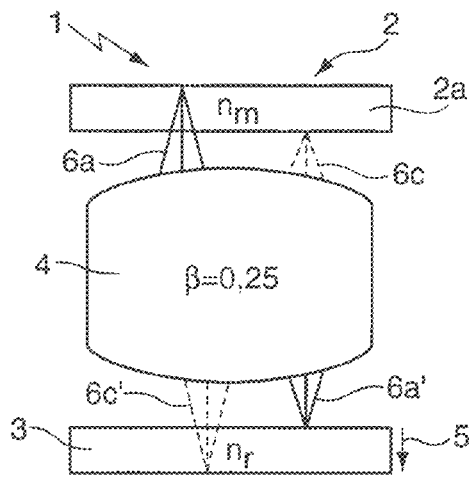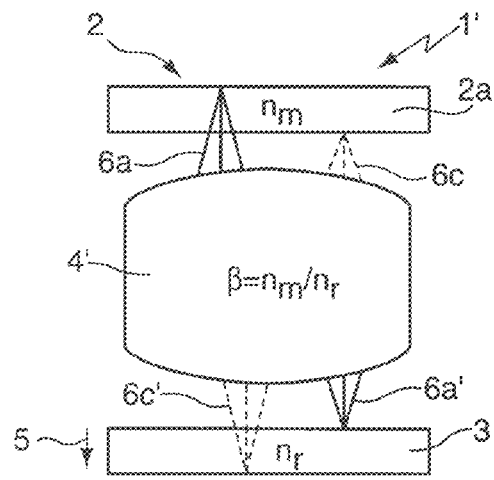
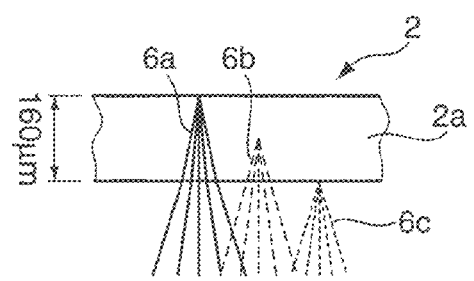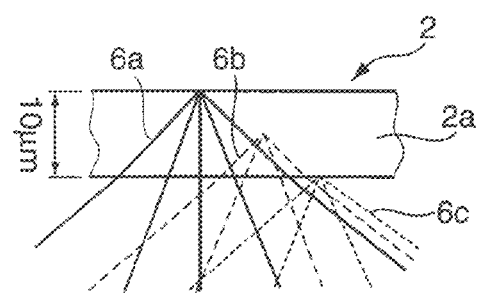
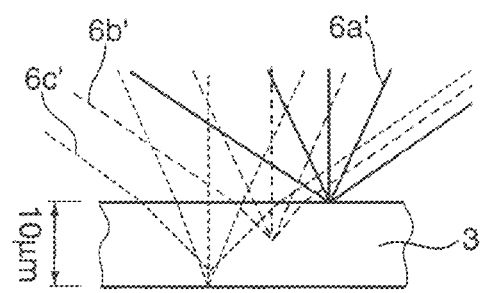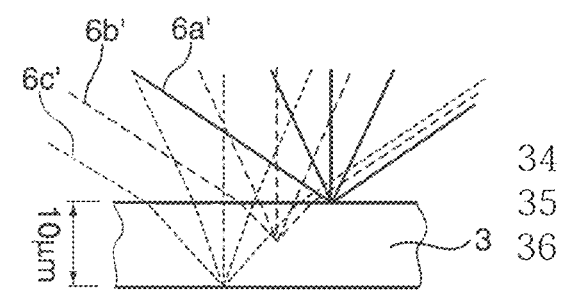

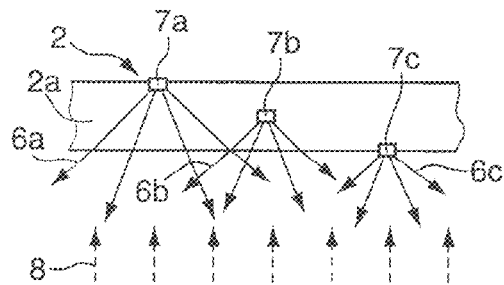
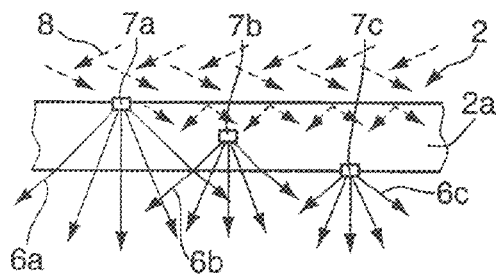
Fig. 3a
Fig. 4a
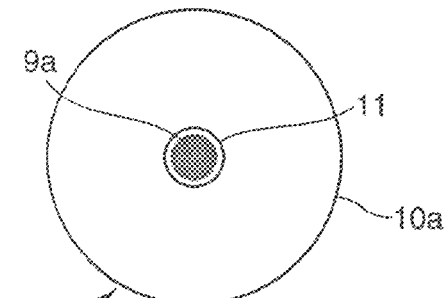
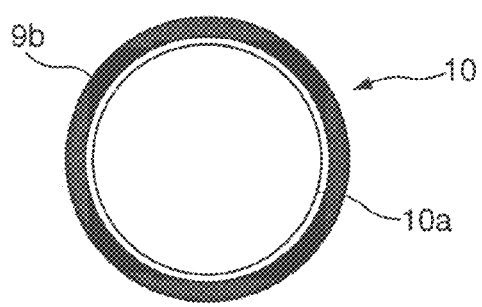
Fig. 3b
Fig. 4b
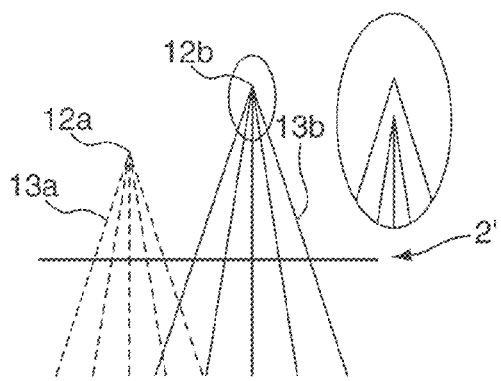
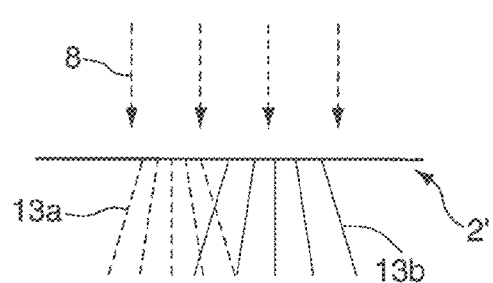
Fig. 5a
Fig. 5b
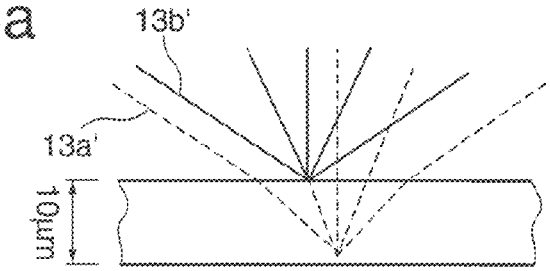
Fig. 5c

US 9,158,205 B2

OPTICAL ARRANGEMENT FOR THREE-DIMENSIONALLY PATTERNING A MATERIAL LAYER

CROSS-REFERENCE TO RELATED APPLICATIONS

This application is a continuation of U.S. Ser. No. 12/607,612, filed Oct. 28, 2009, which claims priority under 35 U.S.C. §119 to German Patent Application 10 2008 043 324.1, filed Oct. 30, 2008, the contents of both are hereby incorporated by reference in their entirety.

FIELD

The disclosure relates to an optical arrangement, such as a projection exposure apparatus for microlithography, for three-dimensionally patterning a radiation-sensitive material layer, to a mask for use in such an optical arrangement, and to a method for three-dimensionally patterning a radiation-sensitive material layer.

BACKGROUND

Photonic crystals, interconnect layers of semiconductor components and micromechanical elements drive the demand for three-dimensional patterning of elements in the field of microelectronics. Conventionally lithographic methods are used for producing three-dimensional structures, which methods involve producing the semiconductor elements layer by layer using different masks. In this case, firstly a photoresist (resist) as radiation-sensitive material layer is applied to a carrier (substrate) and exposed by a first lithographic mask. This is followed by a chemical development step, in which the illumination pattern produced in the course of the preceding exposure in the photoresist is transferred into a physical structure in the photoresist. In order to achieve a three-dimensional patterning, the abovementioned steps, namely the application of a photoresist layer, the exposure of the layer and the subsequent chemical development, are typically to be repeated a number of times using different lithography masks. This method can be very complicated and hence time- and cost-intensive.

SUMMARY

In some embodiments, the disclosure allows for three-dimensional exposure of a comparatively thick radiation-sensitive material layer with a high resolution in three dimensions.

In certain embodiments, the disclosure provides an optical arrangement that includes a mask for forming a three-dimensional radiation pattern, and a substrate with the radiation-sensitive material layer. The optical arrangement also includes a projection optical unit for imaging the three-dimensional radiation pattern from the mask into the radiation-sensitive material layer. The optical arrangement is designed to compensate for spherical aberrations at the same time at least within a first plane and a second plane, which are located at different positions along the thickness direction of the radiation-sensitive material layer (e.g., along a direction perpendicular to the radiation-sensitive material layer), to generate a stigmatic image of the three-dimensional radiation pattern in the radiation-sensitive material layer.

The disclosure proposes exposing all at once a volume in the radiation-sensitive material whose extent in the thickness direction corresponds to more than twice (e.g., five times, or even more than ten times) the depth of focus (given by $\lambda/NA_B^2$, $\lambda$: wavelength of the radiation used, $NA_B$: image-side numerical aperture of the projection optical unit) during the imaging of a two-dimensional structure. Typically, in this case in a predetermined position of the substrate, the entire radiation-sensitive material layer over a thickness of, for example, approximately 10 μm is exposed simultaneously.

If a conventional optical imaging system for imaging a three-dimensional object into a radiation-sensitive material layer having a high thickness is used, it may not be possible to image the entire three-dimensional object with good quality, for example due to the fact that the spherical aberrations in the volume to be imaged in the object space may not correspond to the spherical aberrations in the imaged volume in the image space. The disclosure proposes compensating for the variations of the spherical aberration along the thickness direction of the radiation-sensitive material layer, which occur in a manner dependent on the vertical focus position on the part of the mask. This can be done by suitably designing the mask and/or the projection optical unit, as is explained in greater detail below.

In some embodiments, the first plane and the second plane are oriented perpendicular to the thickness direction of the material layer.

In some embodiments, the first plane and the second plane are separated from each other by a distance that corresponds to more than twice (e.g., five times, or even more than ten times) the depth of focus.

In certain embodiments, the mask for forming the three-dimensional radiation pattern has a three-dimensionally patterned material layer. This three-dimensionally patterned material layer can have mask structures that are distributed along the thickness direction of the mask over a region of, for example, approximately 10 μm (over a region that is considerably larger than in conventional masks used for two-dimensional lithography).

In some embodiments, for the imaging scale β of the projection optical unit, the refractive index $n_r$ of the radiation-sensitive material layer and the refractive index $n_m$ of the material layer of the mask, the following holds true: $\beta = n_m/n_r$. From fundamental considerations, it is possible to formulate the rule that the beam angles should be identical in the object space and in the image space. This is possible if the imaging scale β (magnification) of the projection optical unit, which is defined in the customary way as β=image size/object size, meets the above condition. It goes without saying that a departure can be made from the above condition, if appropriate, for reasons of structural engineering or other reasons, where the condition is still considered to be met provided that deviations between the two sides of the equation are less than approximately 50%, such as less than 10%. Through suitable choice of the imaging scale β for given refractive indices of the material of the mask or the resist, the contributions thereof to the spherical aberration can precisely be compensated for. A typical material used for the mask is quartz glass, which has a refractive index $n_m$ of approximately 1.56 at a wave length of 193 nm. A typical material for a lithographic photoresist has a refractive index $n_r$ of approximately 1.7, thus resulting in an imaging scale β of approximately 0.918 in order to comply with the above condition. A lithographic projection objective as a projection optical unit having an imaging scale of approximately 1:1 is known for example from US 2006/0268253, which, with regard to this aspect, is herein incorporated by reference.

In certain embodiments, the imaging scale β of the projection optical unit can be set in a manner dependent on the refractive index of the radiation-sensitive material layer and the refractive index of the material layer of the mask, such as in an interval between $0.8<\beta<1.2$. Besides the materials mentioned above, it is also possible, of course, to use materials having a different refractive index, such that it is advantageous to make the imaging scale of the projection optical unit adjustable for adaptation to these different materials.

In some embodiments, the optical arrangement includes an illumination system for introducing radiation into the material layer of the mask, where the optical arrangement is designed to allow only a portion of the radiation that is scattered at the structures in the material layer of the mask to enter into the projection optical unit.

Some components, for example photonic crystals, have a substantially periodic three-dimensional structure. In this case, the specific functionality of the structure is coded in deliberately chosen deviations from the periodic structure. By way of example, waveguides or resonator modes can be produced in this way. Compared with the underlying periodic structure, these intentionally introduced defects are comparatively rare. An economic approach for constructing such structures is to use a simple method for producing the basic structure, such as, for example, full-beam interference or the use of densely packed colloids for producing an inverse opal structure. The defects then have to be introduced in a second step using three-dimensional lithography.

In this case, the desired accuracy of the lithographic exposure are generally still high, though the number of structures to be imaged is itself typically comparatively low, such that a large volume region of the material layer of the mask is transparent and contains no structures to be imaged. In order nevertheless to ensure a high contrast during imaging, the situation in which radiation from these transparent regions impinges on the resist should be avoided. Therefore, illumination configurations are desired in which no unscattered light reaches the radiation-sensitive material layer. Two such configurations are described below.

In certain embodiments, the structures in the material layer of the mask are embodied in reflective fashion and the illumination system can be designed to generate coherent illumination. The use of a mask having reflective structures makes it possible to prevent that portion of the illumination radiation which is transmitted at the transparent regions of the mask from entering into the projection objective. In this case, a coherent illumination can be used in order to radiate the radiation of the illumination system at every point almost perpendicularly onto the mask, such that the illuminated solid angle range is very small. This illuminated solid angle range in this case forms a central obscuration (shading) in the entrance pupil of the projection optical unit.

In some embodiments, the illumination system is designed to generate dark field illumination. In this case, the mask is typically operated in transmission and the illumination radiation impinges on the mask at solid angles which are chosen to be greater than the acceptance angle of the projection optical unit, such that likewise only the radiation scattered at the structures in the mask can enter into the projection optical unit.

In certain embodiments, the mask for forming the three-dimensional radiation pattern has a holographic structure, which at least partly compensates for spherical aberrations along the thickness direction of the radiation-sensitive material layer. It goes without saying that the holographic structure of the mask can be embodied as a phase hologram, amplitude hologram or a combination of the two.

It is known to carry out three-dimensional lithography by a holographic mask instead of a three-dimensionally patterned mask. However, if a hologram is produced for this purpose and imaged by a projection optical unit whose imaging scale deviates significantly from one, for example if the hologram is used in a wafer stepper with an imaging scale 1:4, the same problem as described above can occur. If a correction is performed for a focus position, the image of the three-dimensional radiation pattern at locations deviating from this position in the thickness direction of the radiation-sensitive material has spherical aberrations and is not stigmatic.

The disclosure proposes implementing this effect at least partly (e.g., completely) by suitable patterning of the holographic structure coded in the hologram. This is possible particularly when a computer generated hologram (CGH) is used which is patterned by a laser beam or an electron beam. The program steps that can be used to produce such a computer generated hologram are in this case known in principle to the person skilled in the art. The hologram produces in this case a three-dimensional radiation pattern whose direct (virtual or real) image is blurred. It is as a result of the imaging by a projection optical unit, typically having a high demagnification, a high numerical aperture in the image region and a refractive index in the image region of greater than one, that a sharp image is produced in the radiation-sensitive material layer.

The holographic mask can have a diffraction grating to diffract radiation from an illumination system, which can be designed to generate oblique illumination, into the projection optical unit. As already explained above in connection with the three-dimensionally patterned mask, it is favorable for light transmitted by the mask not to impinge on the radiation-sensitive material layer. This can be achieved by setting at the illumination system an illumination setting in the case of which radiation is radiated in from a fixed "oblique" direction outside the entrance-side aperture of the projection optical unit. In order to diffract the radiation into the projection optical unit in this case, a diffraction grating is provided at the holographic mask. This procedure can be referred to as carrier frequency method since the hologram approximately corresponds to a holographic recording with an obliquely incident reference wave. In the mask plane, a spatial frequency dependent on angle of incidence and wavelength corresponds to an obliquely incident wave.

In certain embodiments, the mask can be displaced perpendicular to an object plane of the projection optical unit by a magnitude of more than $3\ \lambda/NA_O^2$ (e.g., more than $10\ \lambda/NA_O^2$, more than $20\ \lambda/NA_O^2$), and/or the light-sensitive material layer can be displaced perpendicular to an image plane of the projection optical unit by a magnitude of more than $3\ \lambda/NA_B^2$ (e.g., more than $10\ \lambda/NA_B^2$, more than $20\ \lambda/NA_B^2$), where $\lambda$ denotes the wavelength of the radiation used, $NA_O$ denotes the object-side and $NA_B$ the image-side numerical aperture of the projection optical unit. The magnitude of the displacement and hence the defocusing of the reticle or of the wafer from the respective focal plane of the projection optical unit exceeds the range of the depth of focus of a two-dimensional object or image, given by $\lambda/NA_O^2$ or respectively by $\lambda/NA_B^2$, at least twice. In this case, the degree of defocusing increases normally with the thickness to be exposed of the radiation-sensitive material layer. Via the defocusing, it is possible to influence the region ("effective radius"), in which the given mask structure has effects on the image in the radiation-sensitive material layer. A small defocus leads to a local effect, whereas a large defocus enables the energy of a larger area in the object to be concentrated onto a smaller area in the image. When an excessively large defocus is used, however, the complexity for calculating the hologram, which increases as the effective radius becomes larger since an "inverse problem" has to be solved in the calculation, increases. Furthermore, in the case of an excessively large defocus, the sensitivity of the holographic structure toward coherence effects in the illumination increases.

The optical arrangement can include an illumination system designed to produce a relative numerical aperture σ of less than 0.1 (e.g., less than 0.05, less than 0.03). In this case, the relative numerical aperture σ (degree of coherence) is defined as the ratio of the object-side numerical aperture of the projection optical unit to the exit-side numerical aperture of the illumination system. As already explained above, it is favorable for the illumination to be coherent to a significantly greater extent than is currently customary, in order that the hologram can represent the desired intensity profile well over a larger depth range, that is to say that the illuminated solid angle range has to be very small. In the case of conventional illumination (incidence of the illumination light perpendicular to the object plane), this can be ensured for the above-specified ranges of the relative numerical aperture.

In some embodiments, the optical arrangement is designed for operation with radiation at a wavelength of 400 nm or less (e.g., 200 nm or less, such as at 193 nm). With the use of typical wavelengths for microlithography of, for example, 193 nm, it is possible to use conventional projection exposure apparatuses for microlithography as optical arrangements for three-dimensional lithography, provided that they are suitably modified for this application. In order to reduce the extent of the focus in the thickness direction of the radiation-sensitive material layer, it may be appropriate also to use comparatively large wavelengths of, such as 365 nm or higher, and to achieve the high lateral resolution by a very large numerical aperture of NA 0.6 or greater.

In certain embodiments, the projection optical unit has an image-side aperture of 1.2 or more, such as 1.4 or more. Even if the lateral dimensions of the three-dimensional radiation pattern to be imaged do not require it, it is favorable to use a largest possible image-side numerical aperture in order to reduce the extent of the focus in the thickness direction.

An immersion liquid can be introduced between a last optical element of the projection optical unit and the radiation-sensitive material layer. The immersion liquid can contribute to increasing the numerical aperture. Water, for example, can be used as the immersion liquid. Since the refractive index of the immersion liquid should ideally correspond to the refractive index of the photoresist, which is approximately 1.7, for example, as described above, it is also possible to use immersion liquids having a high refractive index in order to further increase the image-side numerical aperture.

In some embodiments, the disclosure provides a mask for use in an optical arrangement as described above. The mask has, for forming a three-dimensional radiation pattern, a holographic structure, which at least partly compensates for spherical aberrations along the thickness direction of the radiation-sensitive material layer. As explained further above, the holographic mask produces an only partly stigmatic three-dimensional radiation pattern, which is converted into a stigmatic image in the radiation-sensitive material layer by the imaging by the projection optical unit.

In certain embodiments, the disclosure provides a method for three-dimensionally patterning a radiation-sensitive material layer. The method includes forming a three-dimensional radiation pattern, and imaging the three-dimensional radiation pattern into the radiation-sensitive material layer. In the course of forming the three-dimensional radiation pattern and/or in the course of imaging the three-dimensional radiation pattern, spherical aberrations along the thickness direction of the radiation-sensitive layer are compensated for in order to obtain a stigmatic image of the three-dimensional radiation pattern in the radiation-sensitive material layer. As explained above, both by suitable shaping of the three-dimensional radiation pattern and during the imaging of this pattern, it is possible to compensate for the spherical aberrations in the thickness direction of the radiation-sensitive material layer, such that the resolution of the image generated in the radiation-sensitive material layer is of the order of magnitude of approximately 100 nm in all three spatial directions.

In some embodiments, prior to imaging, the mask is displaced perpendicular to an object plane and/or the light-sensitive material layer is displaced perpendicular to an image plane of a projection optical unit used during imaging, by an amount defined in a manner dependent on the type of mask. Each (holographic) mask used can be assigned defocus values for the mask and/or for the substrate. These "design defocus values" define the magnitude of which the mask and/or the substrate are to be defocused in relation to the respective focal planes. The defocus values are then set by suitable actuating devices on the optical arrangement before the three-dimensional structure is imaged.

Further features and advantages of the disclosure emerge from the following description of exemplary embodiments of the disclosure, with reference to the figures of the drawing that show details essential to the disclosure, and from the claims. The individual features can each be realized individually by themselves or as a plurality in any desired combination in a variant of the disclosure.

BRIEF DESCRIPTION OF THE DRAWINGS

Exemplary embodiments are illustrated in the schematic drawings, in which:

FIGS. 1a-c show schematic illustrations of an optical arrangement (a) and also the latter's object region (b) and image region (c) with the use of a conventional projection optical unit;

FIGS. 2a-c show schematic illustrations of an optical arrangement (a) and also the latter's object region (b) and image region (c) with the use of a projection optical unit for generating a stigmatic image;

FIGS. 3a-b show a three-dimensionally patterned mask operated in reflection (a) in the case of coherent illumination and also the entrance pupil of the projection optical unit (b) in the case of this type of illumination;

FIGS. 4a-b show a three-dimensionally patterned mask operated in transmission in the case of dark field illumination (a) and also the entrance pupil of the projection optical unit (b) in the case of this type of illumination;

FIGS. 5a-c show a mask having a holographic structure (a), the mask in the case of coherent illumination (b), and also the image of the three-dimensional radiation pattern that is generated in the resist during the imaging of the mask;

DETAILED DESCRIPTION

Figures 6A, 6B:
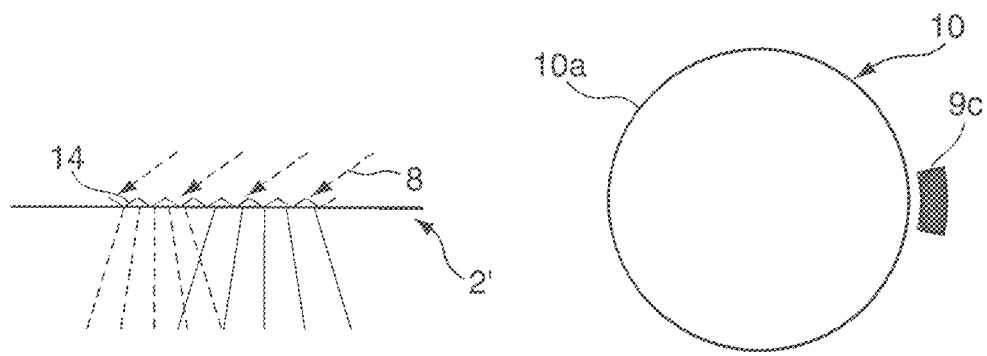
FIGS. 6a-b show a holographic mask with a diffraction grating in the case of oblique illumination (a) and also the entrance pupil of a projection optical unit (b) in the case of this type of illumination.

FIG. 1a schematically shows an optical arrangement 1 including a mask 2 and a resist 3 as a radiation-sensitive material layer. Arranged between the mask 2 and the resist 3 is a projection optical unit 4, which has an imaging scale β of 1:4 that is typical of lithography optical units, and which is designed for imaging two-dimensional structures formed on the mask 2 onto the resist 3. In this case, the thickness of the mask 2 and the thickness of the resist 3 are increased by comparison with the thicknesses conventionally used in lithography for imaging two-dimensional structures, in order to be able to image a three-dimensional object onto a three-dimensional image. In the case of the three-dimensional patterning, too, the intention is to ensure a good quality during imaging independently of the position along a thickness direction 5 of the resist 3.

FIG. 1b shows three beams 6a, 6b, 6c, which enter into an air-filled space below the mask from the upper end, the center and the lower end of the mask 2 and form a three-dimensional radiation pattern in this case. This radiation pattern is imaged into the resist 3 by the projection optical unit 4, in the manner as shown in FIG. 1c, which illustrates the image region of the optical arrangement 1 with the resist 3. Water as the immersion liquid is arranged above the resist 3 in order to produce an image-side numerical aperture $NA_B$ of approximately 1.2. As can likewise be discerned in FIG. 1c, the two imaged beams 6b', 6c' do not generate a stigmatic image on account of spherical aberrations in the radiation-sensitive material layer, that is to say that, unlike the first imaged beam 6a', the beams 6b', 6c' do not combine at one point.

In order to produce a stigmatic imaging of all the beams 6a to 6c, it is desirable for the beam angles in the object region and in the image region to substantially correspond. This can be achieved if the imaging scale β, defined as the ratio of image width to object width, with respect to the refractive index $n_m$ of the material layer 2a of the mask 2 and the refractive index $n_r$ of the resist 3, has the following relationship:

$$\beta = n_m/n_r.$$

As is shown in FIGS. 2a-c for an optical arrangement 1' which meets the above condition, such a coordination of the imaging scale β with the refractive indices of the mask 2 and of the resist 3 leads to a stigmatic imaging in the course of which the images 6a' to 6c' of the beams 6a to 6c each combine at the same time at one point in the resist 3. The images 6a' of the beams 6a combine at one point within a plane 34, which for example coincides with one surface of the resist 3. The images 6b' of the beams 6b combine at one point within a plane 35, which for example is situated inside of the resist 3. The images 6c' of the beams 6c combine at one point within a plane 36, which for example coincides with another surface of the resist 3 that is situated in beam direction downstream the planes 34 and 35. All planes 34, 35 and 36 may be oriented perpendicular to the thickness direction 5 of the resist 3 and may be located at different positions along the thickness direction 5 of the resist 3. For the imaging it is possible in this case to use radiation at a wavelength of 193 nm, at which a material layer 2a composed of quartz glass has a refractive index $n_m$ of 1.56. With the use of a resist 3 having a refractive index $n_r$, this results in an imaging scale β of 0.918 for meeting the above condition.

It goes without saying that, depending on the materials used for the resist 3 and the material layer 2a of the mask 2, the imaging scale β has to be adapted, and so it is expedient to design a projection optical unit 4' such that its imaging scale is variable. This can be done, for example, by virtue of the fact that the distance between the two lenses (not shown) of a lens telescope in the projection optical unit 4' can be set by suitable devices.

In particular in the patterning of preprocessed photonic crystals, that is to say in the case of crystals which already have a basic structure into which only a small number of defect sites are intended to be introduced in the targeted manner by the three-dimensional lithography, the three-dimensionally patterned mask 2 of the optical arrangement 1' shown in FIG. 2a can be transparent to the greatest possible extent and have just a small number of structures 7a-c distributed over the thickness of the material layer 2a, as is shown in FIG. 3a. In this case, in order to obtain a high contrast during the imaging, it is expedient if radiation which passes through these transparent regions does not impinge on the resist 3.

As illustrated in FIG. 3a, this can be achieved by operating the mask 2 in reflection, that is to say by the structures 7a-c with the material layer 2a being embodied in reflective fashion. For the radiation 8 impinging on the mask 2 from an illumination system (not shown), a coherent illumination setting was chosen in this case, that is to say that the radiation 8 impinges on the mask 2 substantially perpendicularly at each point, such that the illumination radiation is distributed over a small solid angle range 9a, which is shown in the entrance pupil 10 of the projection optical unit 4' in FIG. 3b.

In the case of the illustration of the pupil 10 in FIG. 3b, as is generally customary, illumination radiation having a small angle with respect to the optical axis is illustrated as lying radially further inward, while radiation that forms a larger angle with the optical axis is shown as lying radially further outward. In the case shown, the illumination radiation 8 in the solid angle range 9a does not enter into the projection optical unit 4' because the entrance pupil 10 has a so-called central obscuration 11. The latter arises by virtue of the fact that that portion of the beams 6a-c which is backscattered at a small solid angle at the reflective structures 7a-c is scattered into the illumination device provided for producing the coherent illumination and, consequently, only radiation backscattered at the structures 7a to 7c in a solid angle range between the central obscuration 11 and the edge 10a of the entrance pupil 10 can enter into the projection optical unit 4'.

An alternative possibility for preventing light transmitted by the mask 2 from entering into the projection optical unit 4' is shown in FIGS. 4a,b. In this case, the mask 2 is operated in transmission, that is to say that the illumination radiation 8 is scattered forward at the structures 7a-c. In this case, however, the solid angles of the radiation 8 emitted by the illumination system are chosen to be so steep that the latter cannot enter into the projection optical unit 4': as is shown in FIG. 4b, the solid angle range 9b at which the radiation 8 impinges on the projection optical unit 4' lies outside the acceptance angle range thereof, given by the edge 10a of the entrance pupil 10. This type of illumination is also referred to as dark field illumination and ensures that, in the case of the arrangement shown in FIGS. 4a, b, only radiation scattered at the structures 7a-c can enter into the projection optical unit 4'.

In addition or as an alternative to the possibility of obtaining the stigmatic image of a three-dimensional radiation pattern in the resist by correspondingly adapting the projection optical unit 4', it is possible to alter the three-dimensional radiation pattern formed at the mask in such a way that the spherical aberrations occurring in the radiation-sensitive layer are precisely compensated for. Such a modification of the radiation pattern can be effected, for example, by the mask 2' being embodied as a phase and/or amplitude hologram and having holographic structures 12a, 12b (in its virtual image) from which emerge beams 13a, 13b which do not combine at one point, as is illustrated in the enlarged detail illustration for the second holographic structure 12b in FIG. 5a. It goes without saying that holographic structures which generate a stigmatic virtual image can also be provided at the mask 2.

Thus, for example, the first beam 13a combines at one point at the holographic structure 12a.

As is illustrated in FIG. 5b, the mask 2' having the holographic structures 12a, 12b is illuminated coherently with illumination radiation 8 and the beams 13a, 13b emerging therefrom are imaged onto the resist 3 (cf. FIG. 5c) with the aid of the projection optical unit 1 from FIG. 1a on a scale of 1:4. In this case, for those beams 13b which do not generate a stigmatic virtual image at the mask 2, a correction of the spherical aberrations is performed by the demagnifying projection and also the properties of the resist 3, the correction having the effect that a stigmatic image 13a', 13b' of the three-dimensional radiation pattern formed by the beams 13a, 13b arises at each point along the thickness direction of the resist 3, for example at points located within plane 34 and also at points located within plan 35.

As already described with regards to FIGS. 3a,b and also FIGS. 4a,b in connection with a three-dimensionally patterned mask 2, it is expedient in the case of the holographic mask 2', too, if only a small portion of the radiation transmitted by the mask impinges on the resist 3. This can be achieved by setting an oblique illumination, as shown in FIG. 6a, in the case of which illumination the angles of the illumination radiation 8 are chosen in such a way that the solid angle range 9c of the illumination radiation 8 lies outside the edge 10a of the entrance pupil 10 (cf. FIG. 6b), the radiation 8 also being radiated in substantially from a single, constant direction with regard to the azimuthal angle. Such an illumination setting makes it possible to provide a diffraction grating 14 at the holographic mask 2', at which diffraction grating the radiation 8 is diffracted into the entrance pupil 10.

Independently of the type of illumination chosen, the compensation of the spherical aberrations that is desired to generate a stigmatic image is taken into account with the aid of a computer program in the creation of the holographic mask 2'. If the spherical aberrations are completely compensated for by the mask 2', the imaging can indeed be carried out by a conventional projection optical unit, for example, by a projection objective for microlithography, but it is more expedient for the projection optical unit and/or the illumination system used to be suitably modified.

Figure 7:
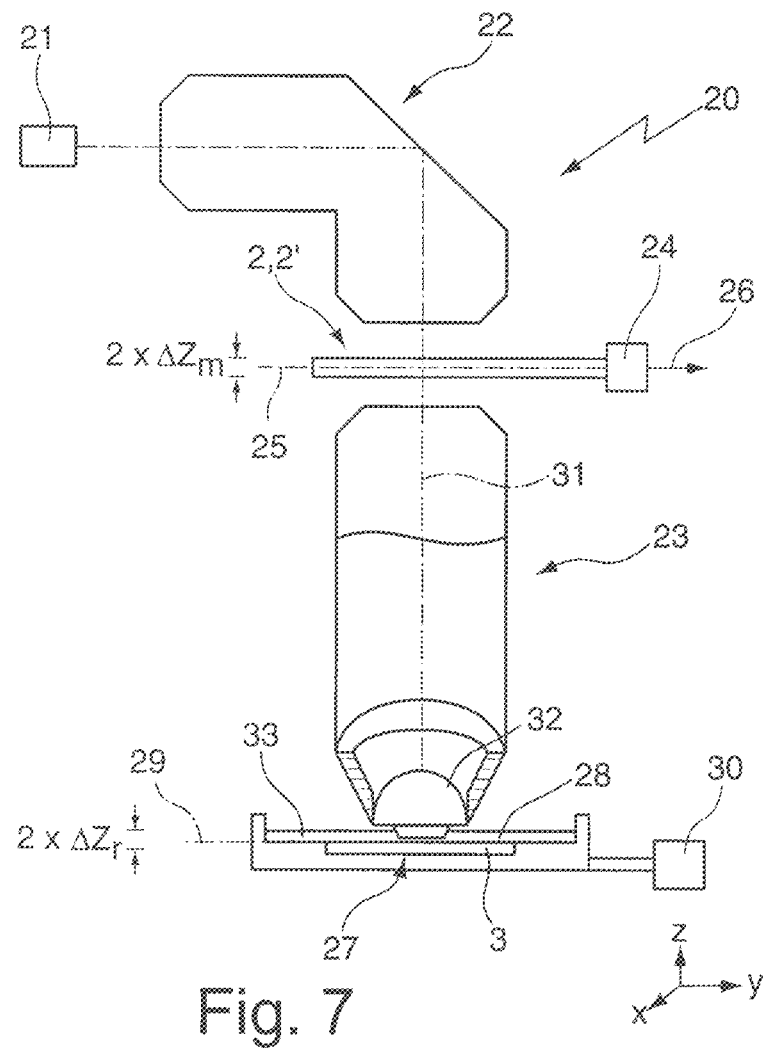
FIG. 7 shows a schematic illustration of a projection exposure apparatus according to the disclosure for microlithography for three-dimensionally patterning a resist.

FIG. 7 shows such a modified projection exposure apparatus 20 for microlithography in the form of a wafer stepper for producing large scale integrated semiconductor components. The projection exposure apparatus 20 includes an excimer laser 21 having an operating wavelength of 193 mm as a light source, other operating wavelengths, for example 248 nm, or 365 nm, also being possible. An illumination system 22 displaced downstream produces in its exit plane a large, sharply delimited, very homogeneously illuminated image field adapted to the desired telecentricity properties of a downstream projection objective 23 serving as a projection optical unit.

A device 24 for holding and manipulating a three-dimensionally patterned mask 2 or a holographic mask 2' is arranged downstream of the illumination system 22 in such a way that the mask lies in the vicinity of the object plane 25 of the projection objective 23 and can be moved in this plane for step and/scan operation in a departure direction indicated by an arrow 26. Either pure stepper operation or combined step and scan operation can be provided in this case.

Downstream of the plane 25, also referred to as mask plane, there follows the projection objective 23, which images an image of a three-dimensional radiation pattern, generated during the illumination of the mask 2, 2', with a reduced scale, for example on a scale of 1:4 or 1:5 or 1:10, onto a wafer 27 coated with a photoresist layer 3. The wafer 27 is arranged in such a way that the planar surface 28 of the photoresist layer 3 substantially coincides with the image plane 29 of the projection objective 23. In this case, the wafer 27 is held by a device 30 including a scanner drive in order to move the wafer 27 synchronously with the mask 2, 2' and (anti-)parallel to the latter. The device 30 also includes manipulators in order to move the wafer both in the z direction parallel to an optical axis 31 of the projection objective 23 and in the x and y directions perpendicular to the axis.

The projection objective 23 has, as terminating element adjacent to the image plane 29, a transparent planoconvex lens 32, which is arranged at a working distance above the substrate surface 28. Arranged between the planoconvex lens 32 and substrate surface 28 is an immersion liquid 33, in the present case water, which increases the output-side numerical aperture of the projection objective 23 to approximately 1.2. As an alternative, it is also possible to use liquids having a high refractive index such as, for example, IF131, IF132, IF169, IF175, n-decane, n-hexane, cyclodecane or cyclohexane, by which a higher image-side numerical aperture can be produced. Via the immersion liquid 33, the imaging of three-dimensional radiation patterns can be effected with a higher resolution than is possible if the interspace between the optical element 32 and the wafer 27 is filled with a medium having a lower refractive index, for example, air.

The projection exposure apparatus shown in FIG. 7 has the following special characteristics for generating a stigmatic image of the radiation pattern produced at the mask 2 or 2' into the resist layer 3 of the wafer 27:

Firstly, the illumination system 22, for producing the desired intensity profile over a large depth range of the resist 3, is designed for generating illumination radiation that is coherent to a significantly greater extent than is usual in conventional illumination systems. For this purpose, the relative numerical aperture σ chosen in the case of perpendicular incidence (cf. FIGS. 4a and 5b) has to be as small as possible and should typically be less than 0.1 (e.g., less than 0.05, less than 0.03), such that the illuminated solid angle range turns out to be very small. An illumination system for producing illumination settings with such a small relative numerical aperture can contain for example a pinhole diaphragm in a diaphragm plane, the form of which predetermines the illumination setting. As an alternative, the illumination setting can also be provided as early as at the designing of the illumination system. It goes without saying that the illumination system 22 can additionally or alternatively also be configured for producing oblique illumination, such as dark field illumination and/or an illumination setting in the case of which the illumination radiation runs in a defined solid angle range outside the entrance pupil of the projection objective 23 (FIGS. 6a, 6b). The way in which the illumination system 22 has to be designed in order to produce the illumination settings described above is known in principle to the person skilled in the art, and so it will not be discussed in any greater detail at this point.

Particularly when a holographic mask 2' is used, the device 24 for retaining the mask 2' should furthermore be displaceable in a range $\Delta Z_m$ in the Z direction around the object plane 25 of the projection objective 23 which is more than $3 \lambda/NA_O^2$ (e.g., more than $10 \lambda/NA_O^2$, more than $20 \lambda/NA_O^2$) and which can extend downward and/or upward from the object plane 25, the range $\Delta Z_m$ specifying the respective deviation from the nominal object plane 25 in the corresponding direction (bottom/top). The same applies to the device 30 for retaining the wafer 27, which is likewise displaceable perpendicular to the image plane 29 of the projection objective 23 by a magnitude $\Delta Z_r$ of more than $3 \lambda/NA_B^2$ (e.g., more than $10 \lambda/NA_B^2$, more than $20 \lambda/NA_\beta^2$) in at least one direction. This displaceability enables a defocusing of the mask 2,2' and of the resist 3, respectively, such that the effective radius, that is to say the region in which a given mask structure influences the image during the imaging, can be chosen in variable fashion.

By way of example, a highly defocused holographic mask can focus the light of a large mask region onto an individual point, while a weakly defocused mask is limited to a greater extent during the focusing of the light. On the other hand, in the design of highly defocused masks it is desirable to take account of the larger transverse range of the diffractive structures, such that the production of numerous fine structures becomes more difficult. In this case, the desired defocus range $\Delta Z_m$ and $\Delta Z_r$, respectively, is dependent on the thickness of the resist 3 and is all the larger, the thicker the resist 3. In this case, each mask 2 can be assigned a defocus value for the displacement of the mask 2 and/or of the resist 3, the defocus value being set automatically or manually on the projection exposure apparatus 20 by suitable devices (not shown).

It goes without saying that the projection objective 23 can also be designed for setting a variable imaging scale β, which can vary in a range of between 0.8 and 1.2, for example, in order to use a three-dimensionally patterned mask 2, as described above in connection with FIGS. 2a-c. In this case, the projection objective 23 has a pair of lenses (not shown) serving as a beam telescope. It goes without saying that in this case the projection objective 23 can be designed for producing an imaging scale of approximately 1:1, for example, by choosing a design such as is described in US 2006/0268253.

Overall, in the manner described above, it is possible to generate an image of a three-dimensional radiation pattern in a radiation-sensitive material layer, the extent of which image in the thickness direction is significantly above that of a conventional two-dimensional imaging, without an impairment of the imaging quality on account of spherical aberration arising in this case. A high image-side numerical aperture, such as can be achieved, for example, by the immersion liquid and/or the use of comparatively large wavelengths, which can also lie above 365 nm, if appropriate, are expedient for the above applications.

What is claimed is:

1. An optical arrangement, comprising:
    a mask comprising a pattern;
    a substrate;
    a radiation-sensitive material supported by the substrate; and
    a projection optical unit configured so that, during use of the optical arrangement, the projection optical unit images at least a portion of the pattern of the mask into an image region of the radiation-sensitive material,
    wherein:
        β is an imaging scale of the projection optical unit;
        $n_r$ is a refractive index of the radiation-sensitive material;
        $n_m$ is a refractive index of the material of the mask;
        $\beta = n_m/n_r$, and wherein β is not 1;
        the radiation-sensitive material has a first plane and a second plane separated from each other by a distance in a thickness direction of the radiation-sensitive material that corresponds to more than twice a depth of focus of the projection optical unit;
        during use of the optical arrangement, the projection optical unit images at least a portion of the pattern of the mask simultaneously into both the first and second planes of the radiation-sensitive material, and beam angles of light in the mask region correspond to respective beam angles of the light in the image region in both the first and second planes of the radiation-sensitive material, and
        the optical arrangement is a microlithography optical arrangement.

2. The optical arrangement of claim 1, wherein the mask is configured so that, during use of the optical arrangement, the projection optical unit images at least a portion of the pattern from the mask into the radiation-sensitive material to provide a three-dimensional pattern in the radiation-sensitive material.

3. The optical arrangement of claim 1, wherein:
    the first and second planes are perpendicular to the thickness direction of the radiation-sensitive material.

4. The optical arrangement of claim 1, wherein:
    during use of the optical arrangement, the optical arrangement compensates for spherical aberrations simultaneously within both the first and second planes to generate a stigmatic image of the three-dimensional radiation pattern in the radiation-sensitive material.

5. The optical arrangement of claim 4, wherein, during use of the optical arrangement, the optical arrangement generates a stigmatic image of the three-dimensional radiation pattern in the radiation-sensitive material.

6. The optical arrangement of claim 1, wherein $0.8<\beta<1.2$.

7. The optical arrangement of claim 1, wherein the mask comprises a three-dimensionally patterned material.

8. The optical arrangement of claim 7, further comprising an illumination system configured so that, during use of the optical arrangement, the illumination system illuminates at least portion of the pattern of the mask with radiation.

9. The optical arrangement of claim 1, further comprising an illumination system configured so that, during use of the optical arrangement, the illumination system illuminates at least portion of the pattern of the mask with radiation.

10. The optical arrangement of claim 9, wherein:
    the mask comprises a three-dimensionally patterned material; and
    the optical arrangement is configured so that, during use of the optical arrangement:
        radiation scatters at structures in the three-dimensionally patterned material of the mask; and
        only a portion of the radiation scattered at the structures in the three-dimensionally patterned material of the mask enters the projection optical unit.

11. The optical arrangement of claim 10, wherein the structures in the three-dimensionally patterned material of the mask are reflective.

12. The optical arrangement of claim 10, wherein the illumination system is configured to generate dark field illumination.

13. The optical arrangement of claim 9, wherein the illumination system is configured to generate dark field illumination.

14. The optical arrangement of claim 1, wherein the optical arrangement is configured to be used with radiation having a wavelength of 400 nm or less.

15. The optical arrangement of claim 1, wherein the projection optical unit has an image-side aperture of 1.2 or more.

16. The optical arrangement of claim 1, further comprising an immersion liquid between a last optical element of the projection optical unit and the radiation-sensitive material.

17. The optical arrangement of claim 1, wherein the mask is configured so that, during use of the optical arrangement, a three-dimensional pattern of radiation is formed in the radiation-sensitive material.

18. The optical arrangement of claim 1, wherein the projection optical unit comprises a lens telescope configured to vary $\beta$.

19. The optical arrangement of claim 1, wherein the spherical aberrations occur in a manner dependent on a vertical focus position on the mask.

20. A method of using an apparatus comprising an illumination system, a mask, a projection optical unit and a radiation-sensitive material, the method comprising:
   selecting so that the mask, the projection optical unit and the radiation-sensitive material so that $\beta=n_m/n_r$, wherein $\beta$ is an imaging scale of the projection optical unit, $n_r$ is a refractive index of the radiation-sensitive material, $n_m$ is a refractive index of the material of the mask, and wherein $\beta$ is not 1;
   using the illumination system to illuminate at least a portion of a pattern of the mask; and
   using the projection optical unit to project at least a portion of the illuminated pattern of the mask into the radiation-sensitive material at a first plane of the radiation-sensitive material, and at a second plane at a second thickness of the radiation-sensitive material, the first plane being different from the second plane, the first and second planes are separated from each other by a distance in a thickness direction of the radiation-sensitive material that corresponds to more than twice a depth of focus of the projection optical unit, wherein spherical aberrations are simultaneously compensated within both the first and second planes of the radiation-sensitive material to generate a stigmatic image of the mask in the radiation-sensitive material.

* * * * *

UNITED STATES PATENT AND TRADEMARK OFFICE
CERTIFICATE OF CORRECTION

| | | |
|---|---|---|
| PATENT NO. | : 9,158,205 B2 | Page 1 of 1 |
| APPLICATION NO. | : 14/526839 | |
| DATED | : October 13, 2015 | |
| INVENTOR(S) | : Heiko Feldmann | |

It is certified that error appears in the above-identified patent and that said Letters Patent is hereby corrected as shown below:

In the specification

Col. 8, line 30, delete "that that" and insert -- that --.

Col. 10, line 29, delete "wafer 27:" and insert -- wafer 27. --.

Signed and Sealed this
Sixteenth Day of February, 2016

Michelle K. Lee
*Director of the United States Patent and Trademark Office*